United States Patent [19]

Taji

[11] Patent Number: 4,810,666
[45] Date of Patent: Mar. 7, 1989

[54] METHOD FOR MANUFACTURING A MOSIC HAVING SELF-ALIGNED CONTACT HOLES

[75] Inventor: Satoru Taji, Toyonaka, Japan
[73] Assignee: Ricoh Company, Ltd., Tokyo, Japan
[21] Appl. No.: 751,187
[22] Filed: Jul. 2, 1985

[30] Foreign Application Priority Data

Jul. 3, 1984 [JP] Japan .................. 59-137687

[51] Int. Cl.⁴ .................. H01L 21/425; H01L 29/78
[52] U.S. Cl. .................. 437/030; 437/43; 437/44
[58] Field of Search .................. 437/27, 29, 30, 41, 437/43, 44

[56] References Cited

U.S. PATENT DOCUMENTS

| | | | |
|---|---|---|---|
| 4,330,931 | 5/1982 | Liu | 29/571 |
| 4,404,733 | 9/1983 | Sasaki | 29/571 |
| 4,488,351 | 12/1984 | Momose | 29/578 |
| 4,541,166 | 9/1985 | Yamazaki | 29/571 |
| 4,551,908 | 11/1985 | Nagasawa et al. | 29/571 |
| 4,557,036 | 12/1985 | Kyuragi et al. | 29/571 |
| 4,616,399 | 10/1986 | Ooka | 437/44 |
| 4,640,000 | 2/1987 | Sato | 29/571 |
| 4,646,426 | 3/1987 | Sasaki | 29/571 |

FOREIGN PATENT DOCUMENTS 8202283  7/1982  PCT Int'l Appl. .................. 437/43

OTHER PUBLICATIONS

Gargini et al., "WOS: Low-Resistance Self-Aligned Source, Drain and Gate Transistors", Technical Digest of IEDM, pp. 54–57, (1981).

Primary Examiner—Olik Chaudhuri
Attorney, Agent, or Firm—Cooper & Dunham

[57] ABSTRACT

A method for manufacturing a MOSIC includes a step of forming a protective film of silicon nitride, which covers the top and side walls of a gate electrode structure including a doped polysilicon, a step of forming an interlayer insulating film and a step of forming a contact pattern in the interlayer insulating film immediately adjacent to a portion of the protective film in a self-aligned fashion with respect to the gate electrode structure. The presence of the protective film which covers the top and side walls of the doped polysilicon, which defines a gate electrode of a MOSFET, allows forming a pair of associated contact holes for drain and source regions in a self-aligned fashion, which contributes for higher integration.

10 Claims, 3 Drawing Sheets

METHOD FOR MANUFACTURING A MOSIC HAVING SELF-ALIGNED CONTACT HOLES

BACKGROUND OF THE INVENTION

1. Field of the Invention

This invention relates to a method for manufacturing a semiconductor device, and, in particular, to a method for manufacturing a polysilicon-gate metal oxide semiconductor integrated circuit (MOSIC).

2. Background of the Invention

A polysilicon-gate MOSIC is well known in the art. Use of polysilicon to form the gate electrode of a self-aligned MOS field effect transistor (FET), contributes to increase in the density of MOSFETs. In such a prior art MOSFET or MOSIC, the gap a (see FIG. 3) between the side edge of a polysilicon gate 2 and the side edge of a contact hole 6 or 8 in a field region 4 was required to be in the order of 2 to 3 microns. This is the minimum required for preventing the metal layer formed in the contact holes 6 and 8 for establishing an electrical contact with diffusion regions defined in a substrate, from contacting the polysilicon gate 2 to establish an undesired short circuit. This has been an impediment in further efforts to increase the density of MOSIC.

SUMMARY OF THE INVENTION

In accordance with the principle of the present invention, there is provided a method for manufacturing a semiconductor device including a polysilicon-gate field effect transistor, wherein the side wall of the gate is protected by a vertical insulating film so that a contact hole can be formed immediately adjacent to the gate in a self-aligned fashion with respect to the gate.

It is therefore a primary object of the present invention to obviate the disadvantages of the prior art as described above and to provide an improved method for manufacturing a semiconductor device.

Another object of the present invention is to provide a method for manufacturing a MOSIC having a contact hole self-aligned with its associated gate, thereby minimizing the gap between the gate and the contact hole.

A further object of the present invention is to provide an improved method for manufacturing a high density MOSIC at high reliability.

A still further object of the present invention is to provide a method for manufacturing a MOSIC having a lightly doped drain (LDD) structure of a diffusion region suitable for high integration.

Other objects, advantages and novel features of the present invention will become apparent from the following detailed description of the invention when considered in conjunction with the accompanying drawings.

DESCRIPTION OF THE PREFERRED EMBODIMENTS

Referring now to FIGS. 1a through 1h, the preferred process of the present invention will be described in detail.

Figure 1A:
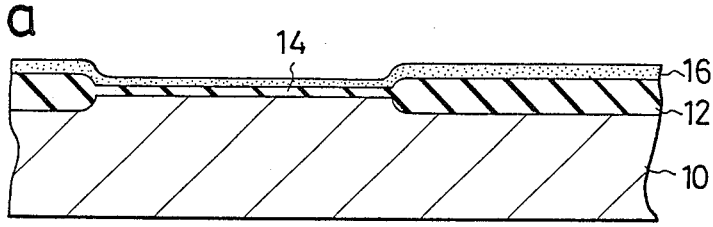
FIGS. 1a through 1h are schematic, cross-sectional views showing the structure at representative steps in accordance with the preferred process embodying the present invention.

In the first place, there is provided a silicon substrate 10, and, as shown in FIG. 1a, the silicon substrate 10 is selectively oxidized to form a field oxide layer of $SiO_2$ thereby defining the so-called field region. Then, a thin film 14 of $SiO_2$ is formed in an active or device region surrounded by the field region, which defines a gate oxide film. Then, a polysilicon layer 16 doped with N conductivity type impurities is formed across the entire surface as shown.

Figure 1B:
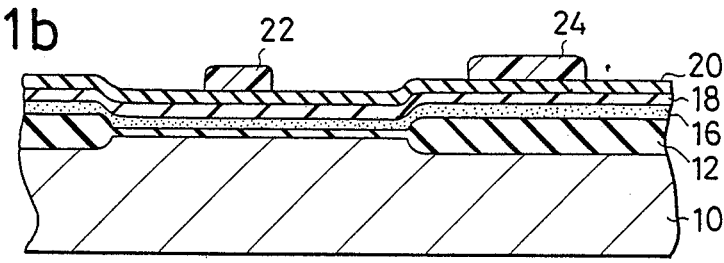

Then, as shown in FIG. 1b, after oxidizing the surface of the polysilicon layer 16 to form a thin oxide film 18 of approximately 500 angstroms thick, a layer 20 of silicon nitride ($Si_3N_4$) is deposited across the entire surface to the thickness of approximately 1,000 angstroms. Then, a layer of resist is uniformly formed on the silicon nitride layer 20 and the resist layer is patterned by any well known method using a mask defining regions of gate electrode and lead lines, so that there is formed a resist pattern by remaining resist portions 22 and 24.

Figure 1C:
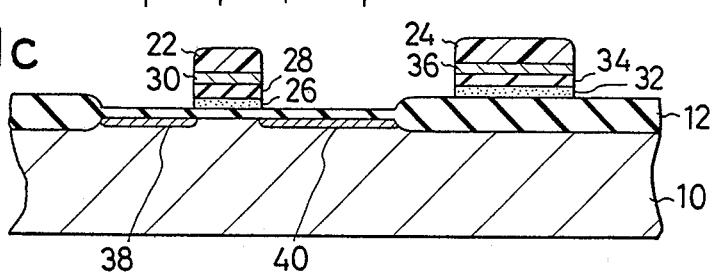

Then, using the resist pattern 22 and 24 as a mask, the silicon nitride layer 20, oxide layer 18 and polysilicon layer 16 are selectively etched in the order mentioned using an appropriate etchant for each layer to be etched, and, as a result, there is defined a gate electrode pattern formed by the remaining polysilicon layer 26, oxide layer 28 and silicon nitride layer 30 and a lead line pattern formed by the polysilicon layer 32, oxide layer 34 and silicon nitride layer 36, as shown in FIG. 1c. Thereafter, ion implantation is carried out to have selected impurities introduced into selected regions of the substrate 10. In this case, in the event of forming a N-channel MOS transistor, N conductivity type impurities, such as P and As, are used, whereas, in the event of forming a P-channel MOS transistor, P conductivity type impurities, such as B, are used. It is to be noted that the amount of impurities to be introduced by this step of ion implantation is relatively small, and its dose is in the order of $1 \times 10^{14}$ ions/cm$^2$. As easily appreciated from FIG. 1c, the resist pattern 22 and 24 and the field oxide 12 serves as a mask in this ion implantation step so that the impurities are only introduced into the substrate 10 in selected regions 38 and 40.

Figure 1D:
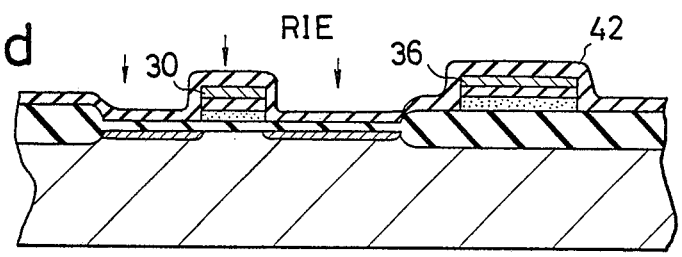

Then, as shown in FIG. 1d, the resist pattern 22 and 24 is removed by any well known method, which is followed by the step of depositing a film 42 of silicon nitride to the thickness of approximately 1,000 angstroms across the entire surface. Thereafter, a reactive ion etching (RIE) process is applied to carry out anisotropic etchino thereby removing the silicon nitride layer 42 excepting those portions of the layer 42 which are formed on top and side walls of the gate electrode pattern and of the lead line pattern. The resulting structure is illustrated in FIG. 1e, wherein a remaining portion 30 of silicon nitride covers the top of the gate electrode pattern and a pair of remaining portions 44 and 45 of silicon nitride cover the side walls of the gate electrode pattern; similarly, a remaining portion 36 of silicon nitride covers the top of the lead line pattern and a pair of remaining portions 46 and 47 of silicon nitride cover the side walls of the lead line pattern.

Figure 1E:
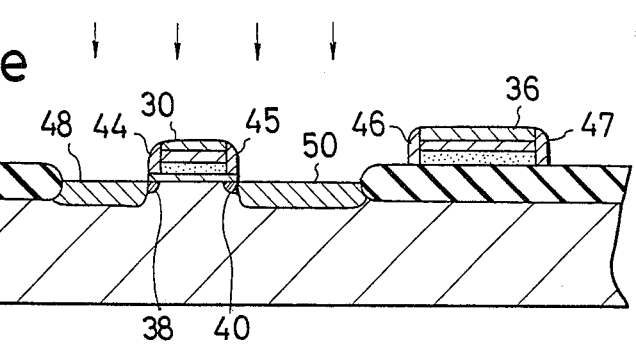

With the gate electrode and lead line patterns protected by the remaining silicon nitride portions as described above, another ion implantation for defining source and drain regions is applied to have selected impurities introduced into the selected regions of the substrate 10, as indicated in FIG. 1e. It is to be noted that, in this case, the protective cover films 30, 36, 44, 45, 46 and 47 and the filed oxide layers 12 serve as a mask against the impurity ions. It should also be noted that the impurities to be used in this step are of the same kind as the impurities used in the previous ion implantation step shown in FIG. 1c; however, the amount of dose is higher in this step and it approximately ranges from $1 \times 10^{15}$ to $4 \times 10^{15}$ ions/cm$^2$. As a result of this second ion implantation step, there are formed selected regions 48 and 50 in the substrate 10 in which the impurities are introduced in this step. It should be noted that the presence of the vertical silicon nitride films 44 and 45 on the side walls of the gate electrode pattern keeps those portions of the previously implanted regions 38 and 40 which underlie the vertical silicon nitride films 44 and 45 from being implanted for the second time in this step. Thus, the previously implanted regions 38 and 40 remain immediately below those vertical silicon nitride films 44 and 45 formed on the side walls of the gate electrode pattern. It is to be noted that the inner regions 38 and 40 are lower in impurity concentration as compared with the outside regions 48 and 50.

Figure 1F:
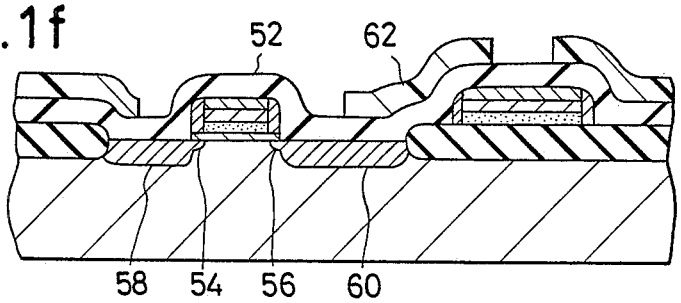

Then, as shown in FIG. 1f, after depositing an interlayer insulating film 52, for example, of PSG across the entire surface, the structure is subjected to heat treatment under the conditions of approximately 1,000° C. for approximately 30 minutes in the environment of oxygen or nitrogen. Because of this heat treatment, the implanted regions in the substrate 10 are activated to define a lightly doped drain (LDD) structure having low concentration diffusion regions 54 and 56 and high concentration diffusion regions 58 and 60.

Figure 1G:
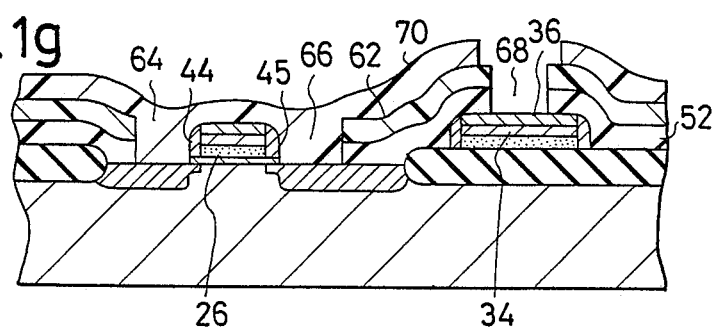

Thereafter, a layer of resist is formed across the entire surface and it is patterned using a mask for defining contact hole regions above the diffusion regions in the substrate 10 and contact hole regions above the lead line on the field oxide 12. Thus, there is formed a resist pattern 62 as shown in FIG. 1f. Then, as shown in FIG. 1g, using this resist pattern 62 as a mask, the interlayer insulating film 52 is selectively etched to define contact holes 64 and 66 above the diffusion regions 58 and 60 and a contact hole 68 above the lead line pattern on the field oxide 12. Of importance, the vertical silicon nitride films 44 and 45 formed on the side walls of the gate electrode pattern serve as part of mask when the interlayer insulating film 52 is etched away selectively to define contact holes 64 and 66 on both sides of the gate electrode pattern, so that the contact holes 64 and 66 are formed in a self-aligned fashion with respect to the gate electrode pattern. Thus, the contact holes 64 and 66 are formed immediately adjacent to the gate electrode pattern as separated therefrom only by the vertical silicon nitride films 44 and 45.

Figure 1H:
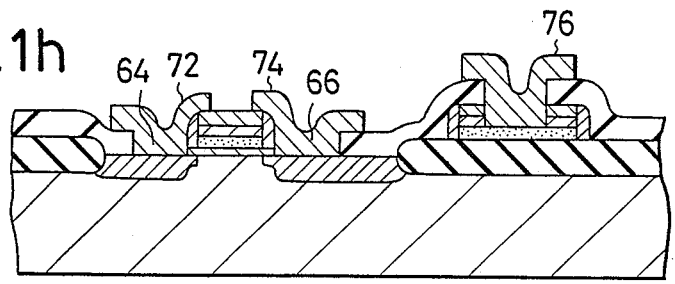

Then, as shown in FIG. 1g, a still another layer 70 of resist is formed across the entire surface and the resist layer 70 is patterned to define a hole which is located above and larger in size by 1 to 3 microns than the contact hole 68 for the lead line pattern. Then, using both of the resist patterns 62 and 70 as a mask, the silicon nitride film 36 and oxide film 34 forming part of the lead line pattern above the field oxide 12 are selectively etched. Thereafter, both of the resist patterns 62 and 70 are removed completely by any well known technique. Then, as shown in FIG. 1h, a metal layer is formed by deposition across the entire surface and then the metal pattern thus deposited is patterned to form metal contacts 72, 74 and 76 which are electrically connected to the diffusion regions 58 and 60 and the doped polysilicon lead line 32, respectively. The metal contacts 72 and 74 are electrically insulated from the doped polisilicon gate 26 by means of the protective silicon nitride films 44 and 45.

Figure 2:
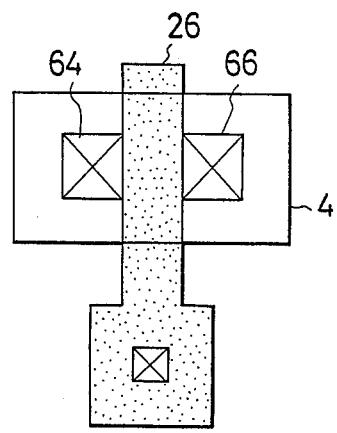
FIG. 2 is a schematic plan view showing the positional relation between a polysilicon-gate 26 and a pair of contact holes 64 and 66 formed on both sides of the gate 26 in a MOSIC constructed in accordance with the present process shown in FIGS. 1a through 1h.
Figure 3:
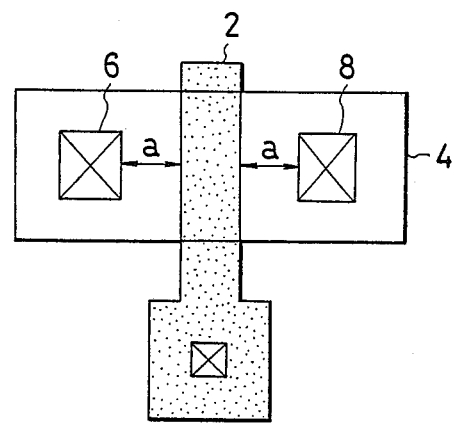
FIG. 3 is a schematic plan view showing the positional relation between a polysilicon-gate 2 and a pair of contact holes 6 and 8 formed on both sides of the gate 2 in a typical prior art MOSIC.

FIG. 2 schematically illustrates in plan view the positional relation between the polysilicon gate 26 and the contact holes 64 and 66 defined on both sides of the polysilicon gate 26 in the structure described with reference to FIGS. 1a through 1h. As can be appreciated without difficulty, the contact holes 64 and 66 are located immediately adjacent to the polysilicon gate 26, and such a close arrangement is possible due to the presence of an insulating protective film formed on the side walls of the polysilicon gate 26. It should be noted that the gap between the polysilicon gate 26 and each of the contact holes 64 and 66 is negligibly small as compared with the corresponding gap a in the prior art structure shown in FIG. 3.

As described in detail above, in accordance with the principle of the present invention, since contact holes for drain/source diffusion regions for a MOSFET are formed in a self-aligned fashion with respect to its associated polysilicon gate electrode, the distance between the gate electrode and the associated contact holes can be minimized, which is advantageous in increasing the density of MOSIC. Furthermore, the present process also allows to establish a LDD structure which is advantageous against the hot carrier problem in a high-integration IC.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A method for manufacturing a semiconductor device, comprising the steps of:

providing a substrate of a first conductivity type having a major surface including a device region at which a relatively thin insulating film is formed and a field region which surrounds the device region and at which a relatively thick insulating film is formed;

forming a gate electrode having top and side walls from a doped polysilicon layer on said relatively thin insulating film with a mask provided on the top wall of said gate electrode;

introducing first impurities of a second conductivity type, which is opposite in polarity to said first conductivity type, into said substrate selectively at a first dose through said relatively thin insulating film using said relatively thick insulating film as a part of a mask;

forming a protective film of a material which covers the top and side walls of said gate electrode and removing said relatively thin insulating film where exposed excepting that portion of said relatively thin insulating film which underlies said gate electrode and that portion said protective film which covers the side walls of said gate electrode;

introducing second impurities of said second conductivity type into said substrate selectively at a second dose using said protective film and said relatively thick insulating film as a mask to define a pair of diffusion regions, one on each side of said gate electrode;

forming an overlaying insulating film across the entire surface;

removing said overlying insulating film at least from said device region to thereby form at least one contact hole in said overlying insulating film immediately adjacent to a portion of said protective film in a self-aligned fashion using said protective film as a part of a mask, said protective film remaining to cover the top and side walls of said gate electrode; and forming a metal contact partly located in said contact hole to be in electrical contact with one of said pair of diffusion regions, said metal contact being electrically isolated from said gate electrode by said protective film.

2. The method of claim 1 further comprising the steps of forming a metal layer across the entire surface and patterning said metal layer according to a desired pattern.

3. The method of claim 1 wherein said second dose is higher than said first dose.

4. The method of claim 3 wherein said first dose is in the order of $1 \times 10^{14}$ ions/cm$^2$ and said second dose is in a range between $1 \times 10^{15}$ and $4 \times 10^{15}$ ions/cm$^2$.

5. The method of claim 1 wherein said step of forming a gate electrode includes the steps of forming said doped polysilicon layer on said substrate, oxidizing the exposed surface of said polysilicon layer, forming a layer of silicon nitride on said oxidized layer and selectivley etching the thus formed ovelrying layers to form said gate electrode.

6. The method of claim 5 wherein said step of selective etching includes the step of forming a resist layer and patterning said resist layer, and wherein said patterned resist is used as part of said mask in said step of introduced said first selected impurities.

7. The method of claim 6 wherein said step of forming a protective film includes the steps of forming a layer of silicon nitride across the entire surface and subjecting said layer of silicon nitride to a reaction ion etching to cause said layer of silicon nitride to be etched away excepting said protective film covering the top and side walls of said gate electrode.

8. The method of claim 1 further comprising the step of subjecting the whole device to heat treatment after said step of forming an overlying insulating film but before said step of patterning said overlying insulating film.

9. The method of claim 8 wherein said step of heat treatment is carried out at the temperature of approximately 1,000° C. for about 30 minutes in the environment of oxygen or nitrogen.

10. The method of claim 9 wherein said overlying insulating film is formed from PSG.

* * * * *